(12) United States Patent
Takeuchi

(10) Patent No.: US 12,262,466 B2
(45) Date of Patent: Mar. 25, 2025

(54) PRINTED BOARD

(71) Applicant: NIDEC SANKYO CORPORATION, Nagano (JP)

(72) Inventor: Junro Takeuchi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 253 days.

(21) Appl. No.: 18/154,200

(22) Filed: Jan. 13, 2023

(65) Prior Publication Data
US 2023/0232530 A1     Jul. 20, 2023

(30) Foreign Application Priority Data
Jan. 20, 2022   (JP) .................................. 2022-007197

(51) Int. Cl.
*H05K 1/02* (2006.01)
*H05K 1/14* (2006.01)

(52) U.S. Cl.
CPC ......... *H05K 1/0275* (2013.01); *H05K 1/0213* (2013.01); *H05K 1/028* (2013.01); *H05K 1/147* (2013.01); *H05K 2201/09454* (2013.01)

(58) Field of Classification Search
CPC .... H05K 1/0213; H05K 1/0275; H05K 1/028; H05K 1/147
See application file for complete search history.

(56) References Cited

FOREIGN PATENT DOCUMENTS

JP           2015225863 A       12/2015

*Primary Examiner* — Jeremy C Norris
(74) *Attorney, Agent, or Firm* — CANTOR COLBURN LLP

(57) ABSTRACT

A printed board includes a main printed board, and a flexible printed board fixed to the main printed board. The flexible printed board includes a box part formed in a box shape whose main printed board side is opened and a fixed part extended to an outer side and fixed to the main printed board. The flexible printed board is formed with a plurality of tamper detection patterns for detecting at least one of disconnection of the tamper detection pattern itself and a short circuit with other tamper detection pattern. An internal land of the tamper detection pattern is connected with the main printed board and is disposed on an inner side of the box part, an external land of the tamper detection pattern is formed in the fixed part and is fixed to and connected with the main printed board, and the external lands are insulated from each other.

6 Claims, 5 Drawing Sheets

PRINTED BOARD

CROSS REFERENCE TO RELATED APPLICATION

The present invention claims priority under 35 U.S.C. § 119 to Japanese Application, 2022-007197, filed on Jan. 20, 2022, the entire contents of which being incorporated herein by reference.

TECHNICAL FIELD

At least an embodiment of the present invention may relate to a printed board.

BACKGROUND

Conventionally, a manual type card reader has been known in which insertion and taking-out of a card is manually performed to read data recorded in the card and write data to the card (see, for example, Japanese Patent Laid-Open No. 2015-225863 (Patent Literature 1)). A card reader described in Patent Literature 1 includes a card reader main body and a case body which covers the card reader main body. The card reader main body includes an IC (Integrated Circuit) contact block having a plurality of IC contact springs, and the IC contact springs are structured to contact with external connection terminals of an IC chip which is formed in a card. The card reader main body is attached with a printed board to which a cable extended from the IC contact block is connected. The case body includes a second case body which covers the printed board.

In the card reader described in Patent Literature 1, a flexible printed board is stuck to an inner side face of the second case body. The flexible printed board is formed with a tamper detection pattern for detecting its own disconnection and short-circuit. The flexible printed board is stuck to the second case body along the inner side face of the second case body so as to cover the entire inner side face of the second case body, and the printed board is covered by the flexible printed board. Further, the flexible printed board is disposed on an inner side of the case body and is not recognized from the outside of the card reader.

In the card reader described in Patent Literature 1, the printed board is covered by the flexible printed board in which a tamper detection pattern is formed and thus, it is possible to detect that some fraudulent act is going to be performed on the printed board by utilizing the tamper detection pattern. In other words, in the card reader described above, security of the printed board can be ensured. However, in the card reader, the flexible printed board is stuck to the second case body and thus, in order to cover the printed board by the flexible printed board, the second case body is required. Therefore, in the card reader, it is difficult to reduce a size of a structure for ensuring security of the printed board.

SUMMARY

In view of the problem described above, at least an embodiment of the present invention may advantageously provide a printed board including a main printed board and a flexible printed board which is formed with a tamper detection pattern, and a size of a structure for ensuring security of the main printed board can be reduced.

According to at least an embodiment of the present invention, there may be provided a printed board including a main printed board and a flexible printed board which is fixed to the main printed board. The flexible printed board is provided with a box part formed in a box shape whose main printed board side is opened, and a fixed part which is extended to an outer peripheral side of the box part and is fixed to the main printed board. The flexible printed board is formed with a plurality of tamper detection patterns, and the tamper detection pattern is provided for detecting at least one of disconnection of the tamper detection pattern itself and a short circuit with other tamper detection pattern. An internal land which is one end part of the tamper detection pattern is electrically connected with the main printed board and is disposed on an inner side of the box part, an external land which is the other end part of the tamper detection pattern is formed in the fixed part and is fixed to and electrically connected with the main printed board, and a plurality of external lands is insulated from each other and each of a plurality of external lands is not electrically connected with other external lands.

In the printed board in accordance with at least an embodiment of the present invention, the flexible printed board formed with a plurality of tamper detection patterns is provided with a fixed part which is fixed to the main printed board, and the flexible printed board is directly fixed to the main printed board. Therefore, according to this embodiment, different from the card reader described in Patent Literature 1, the second case body to which the flexible printed board is stuck is not required. Accordingly, in this embodiment, a size of a structure for ensuring security of the main printed board can be reduced.

Further, in this embodiment, an external land which is the other end part of the tamper detection pattern is formed in the fixed part and is fixed to and electrically connected with the main printed board. Therefore, according to this embodiment, in order that a criminal performs a fraudulent act on the main printed board, when the criminal has torn off the external land from the main printed board for detaching the flexible printed board from the main printed board, it can be detected that the flexible printed board is going to be detached from the main printed board. Accordingly, in this embodiment, security of the main printed board can be enhanced.

Further, in this embodiment, a plurality of external lands is insulated from each other and each of a plurality of external lands is not electrically connected with other external lands and thus, even when a criminal electrically connects the external lands formed in the fixed part with each other, the tamper detection patterns are unable to be short-circuited between the electrically connected external lands. In other words, in this embodiment, even when a criminal electrically connects the external lands with each other, a function of the tamper detection pattern is not impaired. Therefore, according to this embodiment, even when the external lands for directly fixing the flexible printed board to the main printed board are formed in the fixed part which is disposed on an outer side of the box part, security of the main printed board can be enhanced.

In this embodiment, for example, the main printed board is formed in a flat plate shape, the flexible printed board is provided with a board connection part on which the internal land is formed, a shape of the box part when viewed in a thickness direction of the main printed board is a rectangular shape or a square shape, the fixed part is connected with each of three sides of the box part whose shape is a rectangular shape or a square shape when viewed in the thickness direction of the main printed board, and the board connection part is connected with remaining one side of the box part which is not connected with the fixed part and is disposed on an inner side of the box part.

In this case, it is preferable that each of three fixed parts is formed with at least two external lands. According to this structure, when a criminal is trying to detach the flexible printed board from the main printed board for performing a fraudulent act on the main printed board, the external lands are easily peeled off from the external lands from the main printed board. Therefore, it is easily detected that the flexible printed board is going to be detached from the main printed board. In other words, a fraudulent act of a criminal is easily detected.

In this embodiment, it is preferable that the flexible printed board is provided with a tamper detection pattern layer which is formed with a plurality of tamper detection patterns, and a ground pattern layer which is formed with a ground pattern covering the plurality of tamper detection patterns from one side in a thickness direction of the flexible printed board and is overlapped with the tamper detection pattern layer, and the tamper detection pattern layer is disposed on the main printed board side in the box part and the fixed part. In other words, in this embodiment, in the box part and the fixed part, the ground pattern layer which covers a plurality of tamper detection patterns is disposed on an outer side of the tamper detection pattern layer.

According to this structure, the tamper detection pattern layer is not recognized from an outer side of the box part and the fixed part. Therefore, a criminal is hard to recognize that the flexible printed board is formed with a plurality of tamper detection patterns. Further, according to this structure, for example, in a case that a criminal makes a hole in the flexible printed board from the outside of the box part for performing a fraudulent act to the main printed board, even when the tamper detection patterns are not disconnected, the adjacent tamper detection patterns may be short-circuited by copper foil of the ground pattern. Therefore, in this embodiment, a fraudulent act of a criminal is easily detected.

Effects of the Invention

As described above, in accordance with at least an embodiment of the present invention, in a printed board including a main printed board and a flexible printed board formed with a tamper detection pattern, a size of a structure of the printed board for ensuring security of the main printed board is capable of being reduced.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

An embodiment of the present invention will be described below with reference to the accompanying drawings.
(Structure of Printed Board)

Figure 1:
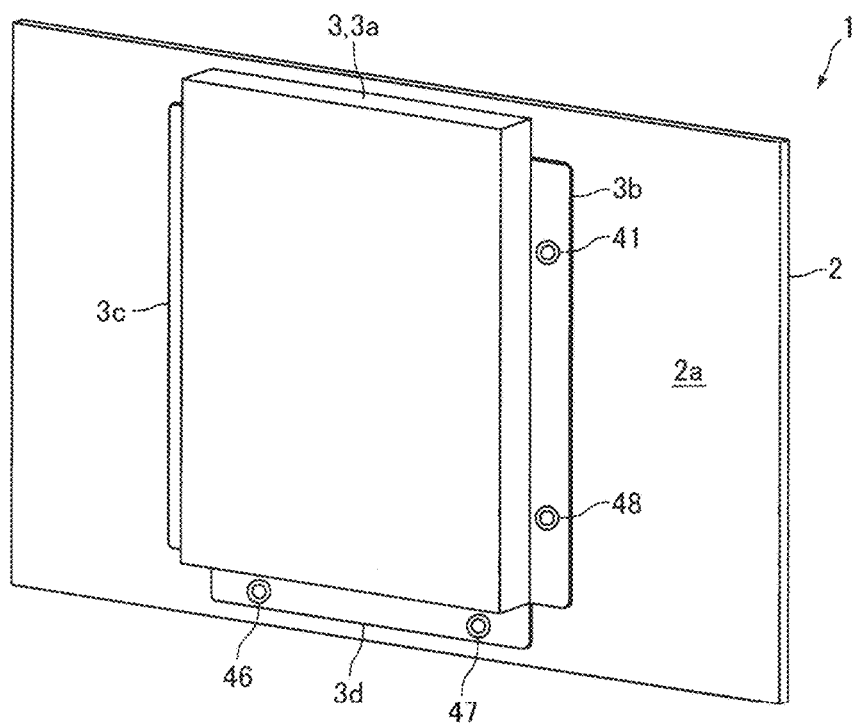
FIG. 1 is a perspective view showing a printed board in accordance with an embodiment of the present invention.
Figure 2:
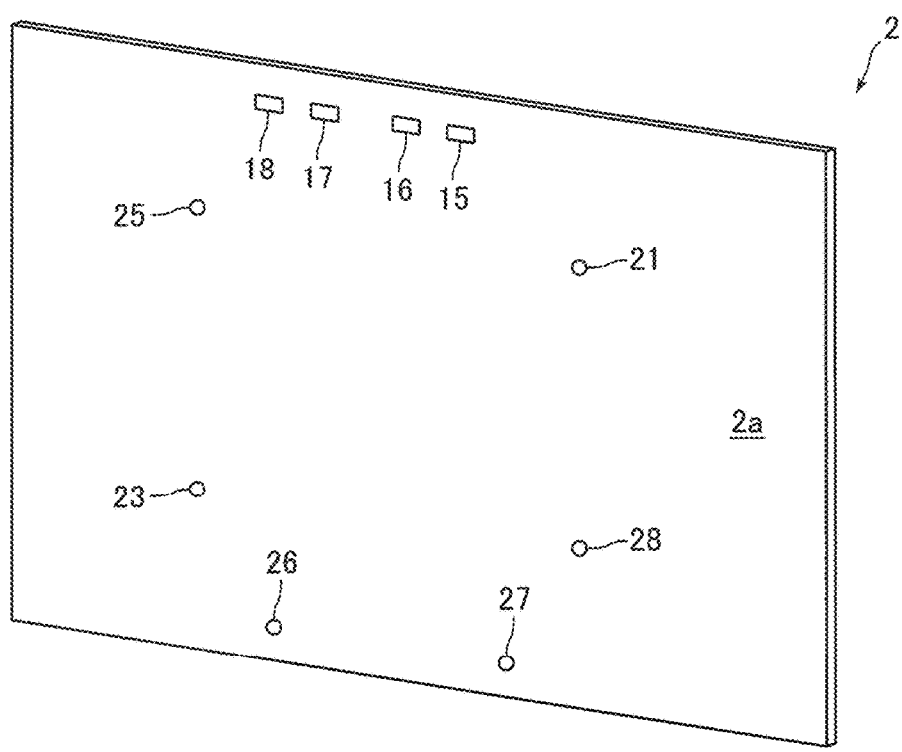
FIG. 2 is a perspective view showing a main printed board in FIG. 1.
Figure 3:
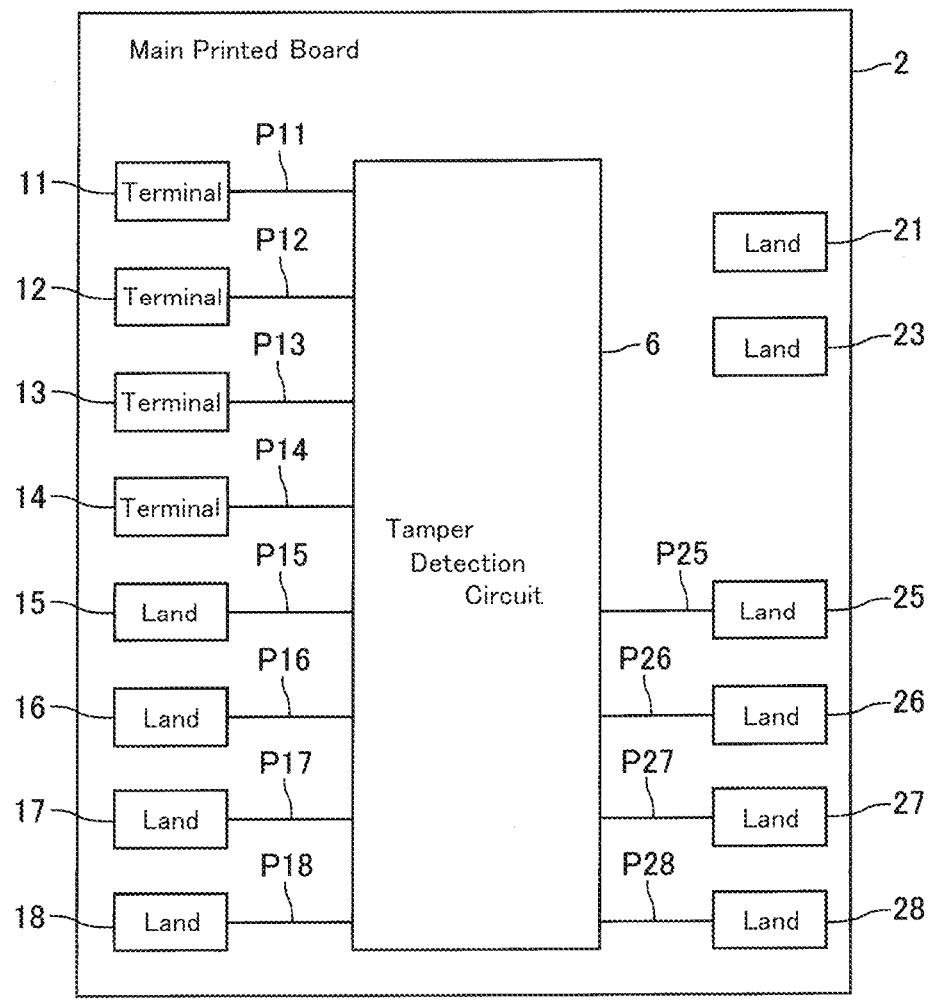
FIG. 3 is an explanatory block diagram showing a structure of the main printed board shown in FIG. 1.
Figure 4A:
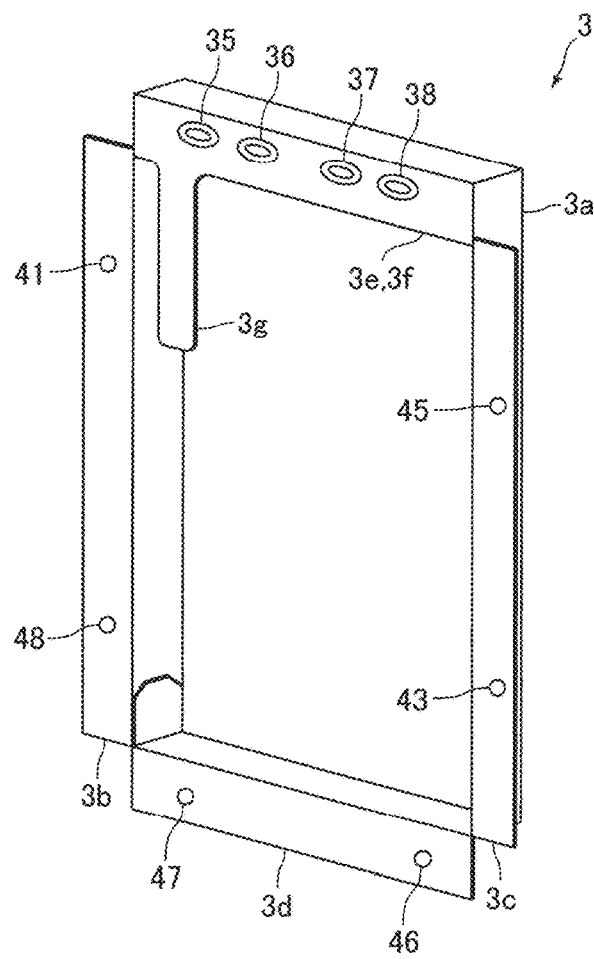
FIG. 4A is a perspective view showing a flexible printed board which is viewed in a different direction from FIG. 1.
Figure 4B:
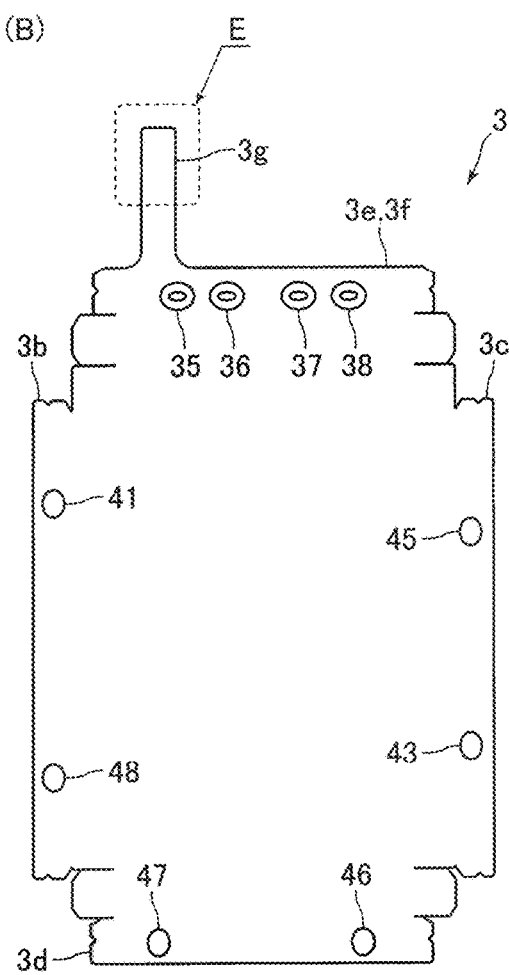
FIG. 4B is a developed view showing the flexible printed board in FIG. 4A.
Figure 5:
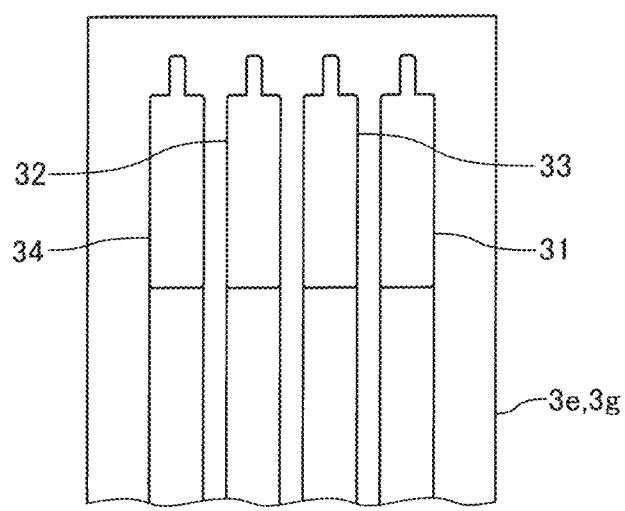
FIG. 5 is an enlarged view showing the "E" part in FIG. 4B.
Figure 6:
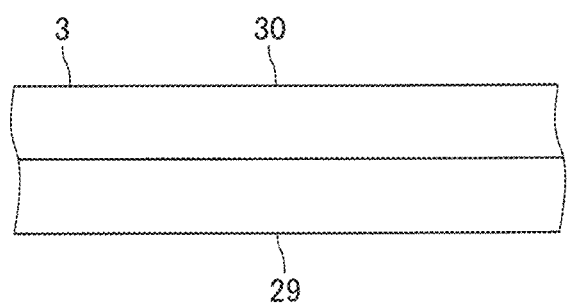
FIG. 6 is a cross-sectional view showing the flexible printed board in FIG. 4A and FIG. 4B.
Figure 7:
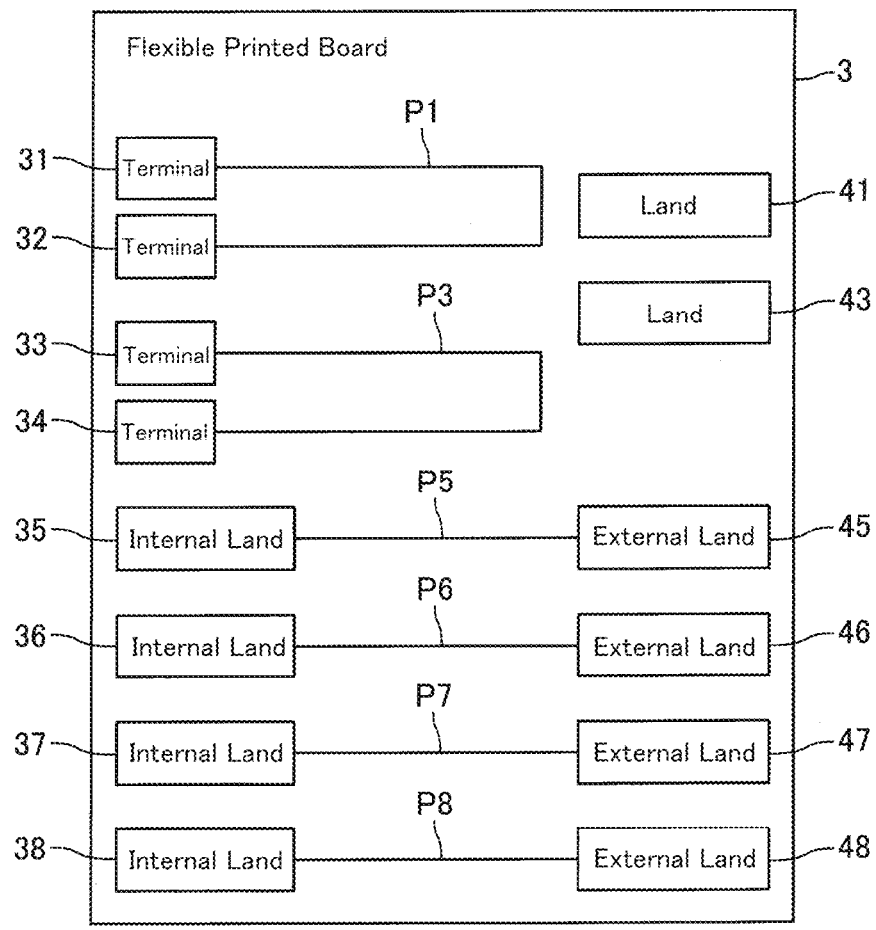
FIG. 7 is an explanatory block diagram showing a structure of the flexible printed board in FIG. 4A and FIG. 4B.

FIG. 1 is a perspective view showing a printed board 1 in accordance with an embodiment of the present invention. FIG. 2 is a perspective view showing a main printed board 2 in FIG. 1. FIG. 3 is an explanatory block diagram showing a structure of the main printed board 2 shown in FIG. 1. FIG. 4A is a perspective view showing a flexible printed board 3 which is viewed in a different direction from FIG. 1, and FIG. 4B is a developed view showing the flexible printed board 3 in FIG. 4A. FIG. 5 is an enlarged view showing the "E" part in FIG. 4B. FIG. 6 is a cross-sectional view showing the flexible printed board 3 in FIGS. 4A, FIG. 4B, and FIG. 7 is an explanatory block diagram showing a structure of the flexible printed board 3 in FIG. 4A and FIG. 4B.

A printed board 1 in this embodiment is, for example, utilized to process data which are communicated with an information storage medium such as a card or a portable device such as a smart phone, and the printed board 1 is mounted and used in a settlement terminal apparatus. The printed board 1 includes a main printed board 2 and a flexible printed board 3 (hereinafter, referred to as an "FPC 3") for ensuring security of the main printed board 2. The printed board 1 in this embodiment is structured of the main printed board 2 and the FPC 3.

The FPC 3 is fixed to the main printed board 2. The FPC 3 is formed with a plurality of tamper detection patterns P1, P3, P5 through P8 (see FIG. 7). In this embodiment, six tamper detection patterns P1, P3, P5 through P8 are formed in the FPC 3. The tamper detection patterns P1, P3, P5 through P8 are provided for detecting own disconnections of the tamper detection patterns P1, P3, P5 through P8 and short-circuits of the tamper detection patterns P1, P3, P5 through P8 with other tamper detection patterns P1, P3, P5 through P8.

The main printed board 2 is a rigid board having rigidity such as a glass epoxy substrate. The main printed board 2 is formed in a flat plate shape. Specifically, the main printed board 2 is formed in a rectangular flat plate shape. As described above, the printed board 1 is, for example, mounted on a settlement terminal apparatus. The main printed board 2 is, for example, electrically connected with at least one of an antenna coil for communicating data with a card, a smart phone or the like in a non-contact manner, IC contact springs which are contacted with external connection terminals of IC contacts formed on a card to communicate data, and a magnetic head for performing reading and the like of magnetic data recorded in a card.

Further, the main printed board 2 is mounted with a tamper detection circuit 6 for detecting disconnections of the tamper detection patterns P1, P3 and P5 through P8 themselves and short-circuits of the tamper detection patterns P1, P3 and P5 through P8 with other tamper detection patterns P1, P3 and P5 through P8. The tamper detection circuit 6 is a CPU (Central Processing Unit). The tamper detection circuit 6 is mounted on one of faces of the main printed board 2. The tamper detection circuit 6 generates tamper detection signals, which flow through the tamper detection patterns P1, P3 and P5 through P8, for detecting disconnections of the tamper detection patterns P1, P3 and P5 through P8 themselves and short-circuits of the tamper detection patterns P1, P3 and P5 through P8 with other tamper detection patterns P1, P3 and P5 through P8.

The main printed board 2 is formed with a plurality of signal patterns P11 through P18 and P25 through P28 for transmitting tamper detection signals generated by the tamper detection circuit 6 to the tamper detection patterns P1, P3 and P5 through P8. In this embodiment, twelve (12) signal patterns P11 through P18 and P25 through P28 are formed in the main printed board 2. One end of each of the signal patterns P11 through P18 and P25 through P28 is connected with the tamper detection circuit 6. Further, the main printed board 2 is formed with a terminal 11 which is the other end part of the signal pattern P11, a terminal 12 which is the other end part of the signal pattern P12, a terminal 13 which is the other end part of the signal pattern P13, and a terminal 14 which is the other end part of the signal pattern P14.

Further, the main printed board 2 is formed with a land (port) 15 which is the other end part of the signal pattern P15, a land 16 which is the other end part of the signal pattern P16, a land 17 which is the other end part of the signal pattern P17, a land 18 which is the other end part of the signal pattern P18, a land 25 which is the other end part of the signal pattern P25, a land 26 which is the other end part of the signal pattern P26, a land 27 which is the other end part of the signal pattern P27, and a land 28 which is the other end part of the signal pattern P28.

Further, the main printed board 2 is formed with lands 21 and 23 for fixing the FPC 3 to the main printed board 2. The lands 21 and 23 are not electrically connected with the tamper detection circuit 6. The terminals 11 through 14 and the lands 15 through 18, 21, 23, and 25 through 28 are formed on one of faces of the main printed board 2 on which the tamper detection circuit 6 is mounted. In the following descriptions, a face of the main printed board 2 on which the lands 15 through 18, 21, 23, 25 through 28 and the like are formed is referred to as a front face 2a, and a face on the opposite side to the front face 2a is referred to as a rear face. In FIG. 2, the tamper detection circuit 6 and the terminals 11 through 14 are not shown.

The main printed board 2 is a multilayer substrate. The main printed board 2 includes a circuit pattern layer in which the signal patterns P11 through P18 and P25 through P28 are formed, a tamper detection pattern layer in which a plurality of tamper detection patterns is formed, and a ground pattern layer in which a ground pattern is formed. A plurality of tamper detection patterns formed in the tamper detection pattern layer of the main printed board 2 is provided for detecting that the tamper detection pattern itself is disconnected and that the tamper detection pattern is short-circuited with another tamper detection pattern.

The tamper detection pattern layer is disposed on a rear face side of the main printed board 2 with respect to the circuit pattern layer, and the ground pattern layer is disposed on a rear face side of the main printed board 2 with respect to the tamper detection pattern layer. A plurality of tamper detection patterns formed in the tamper detection pattern layer covers an area of the main printed board 2 which is required to ensure security from a rear face side of the main printed board 2. In this embodiment, the tamper detection pattern is formed over the entire area of the main printed board 2. The ground pattern formed in the ground pattern layer covers a plurality of tamper detection patterns formed in the tamper detection pattern layer from a rear face side of the main printed board 2. In this embodiment, the ground pattern is formed over the entire area of the main printed board 2.

The FPC 3 is fixed to the front face 2a of the main printed board 2. The FPC 3 is provided with a box part 3a formed in a box shape in which an opening facing the main printed board 2 is defined, fixed parts 3b through 3d which are extended to an outer peripheral side of the box part 3a and fixed to the main printed board 2, and a board connection part 3e which is disposed on an inner side of the box part 3a. Here, a side of the box part 3a in which the opening is defined may be also referred to as a main printed board side. The FPC 3 is formed by bending and fixing a flexible printed board in a flat film shape having flexibility (see FIG. 4B) into a predetermined shape (see FIG. 4A).

The box part 3a is formed in a flat rectangular parallelepiped box shape. A shape of the box part 3a is a rectangular shape when viewed in a thickness direction of the main printed board 2. The box part 3a covers an area of the main printed board 2 which is required to ensure security from a side of the front face 2a (front face side) of the main printed board 2. Specifically, the box part 3a covers the tamper detection circuit 6 and the like from the side of the front face 2a (front face side). Further, in this embodiment, as described above, the main printed board 2 is provided with the tamper detection pattern layer, and an area of the main printed board 2 where security is required to ensure is covered from both sides in a thickness direction of the main printed board 2 by the tamper detection pattern layer of the main printed board 2 and the box part 3a.

The fixed parts 3b through 3d are respectively connected with three sides of the box part 3a whose shape is rectangular when viewed in a thickness direction of the main printed board 2. In other words, the fixed parts 3b through 3d are portions which are respectively bent from three sides on an opening side of the box part 3a toward an outer side, and the fixed parts 3b through 3d are extended in a flange shape from the three sides on the opening side of the box part 3a toward an outer peripheral side of the box part 3a. The board connection part 3e is connected with remaining one side of the box part 3a which is not connected with the fixed parts 3b through 3d. In other words, the board connection part 3e is a portion which is bent from the remaining one side on the opening side of the box part 3a to an inner side. The FPC 3 in this embodiment is structured of the box part 3a, the three fixed parts 3b through 3d, and the board connection part 3e.

The fixed parts 3b through 3d are formed in a long and thin rectangular shape. The board connection part 3e is structured of a land forming part 3f which is formed in a long and thin rectangular shape, and a long and thin strip-shaped part 3g which is extended from the land forming part 3f toward an inner side of the box part 3a. The fixed part 3b is connected with one of long sides of the box part 3a whose shape is rectangular when viewed in a thickness direction of the main printed board 2, and the fixed part 3c is connected with the other of the long sides of the box part 3a. Further, the fixed part 3d is connected with one of short sides of the box part 3a, and the board connection part 3e is connected with the other of the short sides of the box part 3a. The fixed parts 3b through 3d and the board connection part 3e are contacted with the main printed board 2.

The FPC 3 includes a tamper detection pattern layer 29 which is formed with six tamper detection patterns P1, P3, P5 through P8 and a ground pattern layer 30 formed with a ground pattern which covers the six tamper detection patterns P1, P3, P5 through P8 from one side in a thickness direction of the FPC 3 (see FIG. 6). The tamper detection pattern layer 29 and the ground pattern layer 30 are overlapped with each other in a thickness direction of the FPC 3. An insulating layer (not shown) is disposed between the tamper detection pattern layer 29 and the ground pattern layer 30. The tamper detection pattern layer 29 structures one face of the FPC 3, and the ground pattern layer 30 structures the other face of the FPC 3. A surface of the tamper detection pattern layer 29 and a surface of the ground pattern layer 30 are covered by an insulating coating.

In the tamper detection pattern layer 29, the six tamper detection patterns P1, P3, P5 through P8 are irregularly routed. Further, the tamper detection patterns P1, P3, P5 through P8 are routed over the entire area of the tamper detection pattern layer 29. In other words, the tamper detection patterns P1, P3, P5 through P8 are routed in the box part 3a, the fixed parts 3b through 3d, and the board connection part 3e. In the ground pattern layer 30, the ground pattern is formed over the entire area of the ground pattern layer 30. The tamper detection pattern layer 29 is disposed on the opening facing the main printed board 2 in the box part 3a and the fixed parts 3b through 3d. In other words, the ground pattern layer 30 is disposed on an outer side of the tamper detection pattern layer 29 in the box part 3a and the fixed parts 3b through 3d and covers the tamper detection pattern layer 29 from an outer side.

The FPC 3 is formed with a terminal 31 which is one end part of the tamper detection pattern P1, a terminal 32 which is the other end part of the tamper detection pattern P1, a terminal 33 which is one end part of the tamper detection pattern P3, and a terminal 34 which is the other end part of the tamper detection pattern P3. Further, the FPC 3 is formed with an internal land (port) 35 which is one end part of the tamper detection pattern P5, an internal land 36 which is one end part of the tamper detection pattern P6, an internal land 37 which is one end part of the tamper detection pattern P7, and an internal land 38 which is one end part of the tamper detection pattern P8.

Further, the FPC 3 is formed with an external land (port) 45 which is the other end part of the tamper detection pattern P5, an external land 46 which is the other end part of the tamper detection pattern P6, an external land 47 which is the other end part of the tamper detection pattern P7, and an external land 48 which is the other end part of the tamper detection pattern P8. Further, the FPC 3 is formed with lands 41 and 43 for fixing the FPC 3 to the main printed board 2. The lands 41 and 43 are not electrically connected with the tamper detection patterns P1, P3, P5 through P8.

As shown in FIG. 5, the terminals 31 through 34 are formed at a tip end part of the strip-shaped part 3g. The internal lands 35 through 38 are formed in the land forming part 3f. In other words, the internal lands 35 through 38 are formed in the board connection part 3e. Further, the terminals 31 through 34 and the internal lands 35 through 38 are disposed on an inner side of the box part 3a and are not exposed on an outside of the box part 3a.

The terminals 31 through 34 are disposed in a separated state in a shorter direction of the strip-shaped part 3g which is formed in a long and thin strip shape. Further, the terminals 31, 33, 32 and 34 are disposed in this order in a shorter direction of the strip-shaped part 3g. The internal lands 35 through 38 are disposed in a separated state in a long side direction of the land forming part 3f which is formed in a long and thin rectangular shape. Further, the internal lands 35 through 38 are disposed in this order in a long side direction of the land forming part 3f from the a side of the fixed part 3b (fixed part side).

The lands 41 and 43 and the external lands 45 through 48 are formed in the fixed parts 3b through 3d. Specifically, the land 41 and the external land 48 are formed in the fixed part 3b, the land 43 and the external land 45 are formed in the fixed part 3c, and the external lands 46 and 47 are formed in the fixed part 3d. The lands 41 and 43 and the external lands 45 through 48 are exposed on an outside of the box part 3a.

The land 41 and the external land 48 are disposed in a separated state in a long side direction of the fixed part 3b which is formed in a long and thin rectangular shape. Further, the land 41 is disposed on the board connection part 3e side, and the external land 48 is disposed on the fixed part 3d side. The land 43 and the external land 45 are disposed in a separated state in a long side direction of the fixed part 3c. Further, the external land 45 is disposed on the board connection part 3e side, and the land 43 is disposed on the fixed part 3d side. The external lands 46 and 47 are disposed in a separated state in a long side direction of the fixed part 3d. Further, the external land 46 is disposed on the fixed part 3c side, and the external land 47 is disposed on the side of the fixed part 3b (fixed part side).

The terminal 31 is electrically connected with the terminal 11, the terminal 32 is electrically connected with the terminal 12, the terminal 33 is electrically connected with the terminal 13, and the terminal 34 is electrically connected with the terminal 14. Further, the internal land 35 is electrically connected with the land 15, the internal land 36 is electrically connected with the land 16, the internal land 37 is electrically connected with the land 17, and the internal land 38 is electrically connected with the land 18. In other words, the terminals 31 through 34 and the internal lands 35 through 38 are electrically connected with the main printed board 2.

In this embodiment, for example, when the tip end part of the strip-shaped part 3g is inserted into a connector (not shown) which is mounted on the main printed board 2, the terminal 31 and the terminal 11 are contacted and electrically connected with each other, the terminal 32 and the terminal 12 are contacted and electrically connected with each other, the terminal 33 and the terminal 13 are contacted and electrically connected with each other, and the terminal 34 and the terminal 14 are contacted and electrically connected with each other. In the main printed board 2, the respective terminals 11 through 14 are disposed at positions corresponding to the respective terminals 31 through 34.

The internal land 35 is soldered and fixed to the land 15, the internal land 36 is soldered and fixed to the land 16, the internal land 37 is soldered and fixed to the land 17, and the internal land 38 is soldered and fixed to the land 18. In other words, the internal lands 35 through 38 are fixed to the main printed board 2. In the main printed board 2, the respective lands 15 through 18 are disposed at positions corresponding to the respective internal lands 35 through 38.

The external land 45 is electrically connected with the land 25, the external land 46 is electrically connected with the land 26, the external land 47 is electrically connected with the land 27, and the external land 48 is electrically connected with the land 28. In other words, the external lands 45 through 48 are electrically connected with the main printed board 2.

Further, the land 41 is soldered and fixed to the land 21, the land 43 is soldered and fixed to the land 23, the external land 45 is soldered and fixed to the land 25, the external land 46 is soldered and fixed to the land 26, the external land 47 is soldered and fixed to the land 27, and the external land 48 is soldered and fixed to the land 28. In other words, the lands 41 and 43 and the external lands 45 through 48 are fixed to the main printed board 2. In the main printed board 2, the respective lands 21, 23, 25 through 28 are disposed at positions corresponding to the respective lands 41 and 43 and the external lands 45 through 48.

The tamper detection pattern P1 is electrically connected with the signal patterns P11 and P12. The tamper detection pattern P3 is electrically connected with the signal patterns P13 and P14. Further, the tamper detection pattern P5 is electrically connected with the signal patterns P15 and P25, the tamper detection pattern P6 is electrically connected with the signal patterns P16 and P26, the tamper detection pattern P7 is electrically connected with the signal patterns P17 and P27, and the tamper detection pattern P8 is electrically connected with the signal patterns P18 and P28.

The tamper detection pattern P1, the tamper detection pattern P3, the tamper detection pattern P5, the tamper detection pattern P6, the tamper detection pattern P7 and the tamper detection pattern P8 are insulated from each other and are not electrically connected with each other. In other words, the four external lands 45 through 48 are respectively insulated from each other, and each of the external lands 45 through 48 is not electrically connected with other external lands 45 through 48. Further, each of the external lands 45 through 48 is insulated from the two lands 41 and 43 and is not electrically connected with the lands 41 and 43.

The tamper detection signal flowing through the tamper detection pattern P1, the tamper detection signal flowing through the tamper detection pattern P3, the tamper detection signal flowing through the tamper detection pattern P5, the tamper detection signal flowing through the tamper detection pattern P6, the tamper detection signal which flowing through the tamper detection pattern P7, and the tamper detection signal flowing through the tamper detection pattern P8 are set to be different signals from each other. In other words, the tamper detection circuit 6 generates respective tamper detection signals different from each other in the tamper detection pattern P1, the tamper detection pattern P3, the tamper detection pattern P5, the tamper detection pattern P6, the tamper detection pattern P7 and the tamper detection pattern P8.

In this embodiment, when a criminal performs some act for illegally acquiring data from the main printed board 2 to cause the tamper detection patterns P1, P3, P5 through P8 to be disconnected, the tamper detection patterns P1, P3, P5 through P8 to be short-circuited with other tamper detection patterns P1, P3, P5 through P8, or the external lands 45 through 48 to be torn off from the lands 25 through 28, for example, a tamper detection signal does not flow and thus, it is detected that a fraudulent act is performed in the tamper detection circuit 6. When it is detected that a fraudulent act is being performed, predetermined abnormality processing is executed in the main printed board 2, for example, data stored in the main printed board 2 are erased, or the main printed board 2 is set in an unusable state and thereby, illegal acquisition of data from the main printed board 2 is prevented.

(Principal Effects in this Embodiment)

As described above, in this embodiment, the FPC 3 for ensuring security of the main printed board 2 is provided with the fixed parts 3b through 3d which are fixed to the main printed board 2, and the FPC 3 is directly fixed to the main printed board 2. Therefore, according to this embodiment, different from the card reader described in Patent Literature 1, a case body to which the FPC 3 is stuck is not required. Accordingly, in this embodiment, a size of a structure for ensuring security of the main printed board 2 can be reduced.

In this embodiment, the external lands 45 through 48 which are the other end parts of the tamper detection patterns P5 through P8 are formed in the fixed parts 3b through 3d and are fixed to and electrically connected with the main printed board 2. Therefore, according to this embodiment, in order that a criminal performs a fraudulent act on the main printed board 2, when the criminal has torn off the external lands 45 through 48 from the lands 25 through 28 for detaching the FPC 3 from the main printed board 2, the fraudulent act is detected by the tamper detection circuit 6 as described above. Further, in this embodiment, when the fraudulent act is detected, predetermined abnormality processing such that data stored in the main printed board 2 are erased is executed. Therefore, according to this embodiment, security of the main printed board 2 can be enhanced.

In this embodiment, the four external lands 45 through 48 are respectively insulated from each other, and each of the external lands 45 through 48 is not electrically connected with other external lands 45 through 48. Therefore, according to this embodiment, even when a criminal electrically connects the external lands 45 through 48 formed in the fixed parts 3b through 3d with each other, the tamper detection pattern P5 itself, the tamper detection pattern P6 itself, the tamper detection pattern P7 itself and the tamper detection pattern P8 itself are unable to be short-circuited between the electrically connected external lands 45 through 48.

For example, even when the external land 45 and the external land 46 are electrically connected with each other, the tamper detection pattern P5 itself is not short-circuited, and the tamper detection pattern P6 itself is not also short-circuited. Further, for example, even when the external land 47 and the external land 48 are electrically connected with each other, the tamper detection pattern P7 itself is not short-circuited, and the tamper detection pattern P8 itself is not also short-circuited. In other words, according to this embodiment, even when a criminal electrically connects the external lands 45 through 48 with each other, functions of the tamper detection patterns P5 through P8 are not impaired.

Therefore, according to this embodiment, even when the external lands 45 through 48 for directly fixing the FPC 3 to the main printed board 2 are formed in the fixed parts 3b through 3d which are disposed on an outer side of the box part 3a, security of the main printed board 2 can be enhanced. In this embodiment, when a criminal electrically connects the external lands 45 through 48 with each other, it is detected that the tamper detection patterns P5 through P8 are short-circuited with other tamper detection patterns P5 through P8.

In this embodiment, in the box part 3a and the fixed parts 3b through 3d, the ground pattern layer 30 is disposed on an outer side of the tamper detection pattern layer 29 and covers the tamper detection pattern layer 29 from the outer side. Therefore, according to this embodiment, the tamper detection patterns P1, P3, P5 through P8 are difficult to be recognized from the outside of the box part 3a and the fixed parts 3b through 3d. Accordingly, in this embodiment, a criminal is hard to recognize that the tamper detection patterns P1, P3, P5 through P8 are formed in the FPC 3.

Further, in this embodiment, in the box part 3a and the fixed parts 3b through 3d, the ground pattern layer 30 is disposed on an outer side of the tamper detection pattern layer 29. Therefore, for example, in a case that a criminal makes a hole in the FPC 3 from the outside of the box part 3a for performing a fraudulent act to the main printed board 2, even when the tamper detection patterns P1, P3, P5 through P8 are not disconnected, the adjacent tamper detection patterns P1, P3, P5 through P8 may be short-circuited by copper foil of the ground pattern. Accordingly, in this embodiment, a fraudulent act of a criminal is easily detected.

Other Embodiments

Although the present invention has been shown and described with reference to a specific embodiment, various changes and modifications will be apparent to those skilled in the art from the teachings herein.

In the embodiment described above, the number of the tamper detection patterns formed in the FPC 3 may be two (2) through five (5). Further, in the embodiment described above, the number of the tamper detection patterns formed in the FPC 3 may be seven (7) or more. In a case that the number of the tamper detection patterns formed in the FPC 3 is eight or more, it is preferable that each of the three fixed parts 3b through 3d are formed with at least two external lands.

In a case that at least two external lands are formed in each of the three fixed parts 3b through 3d, when a criminal is trying to detach the FPC 3 from the main printed board 2 for performing a fraudulent act to the main printed board 2, the external lands are easily peeled off from the lands formed in the main printed board 2. Therefore, it is easily detected that the FPC 3 is going to be detached from the main printed board 2. In other words, a fraudulent act of a criminal is easily detected.

In the embodiment described above, the tamper detection patterns P1, P3, P5 through P8 may be provided for detecting only one of disconnection of each of the tamper detection patterns P1, P3, P5 through P8 itself and short circuits of the tamper detection patterns P1, P3, P5 through P8 with other tamper detection patterns P1, P3, P5 through P8. Further, in the embodiment described above, the tamper detection pattern which is formed in the tamper detection pattern layer of the main printed board 2 may be provided for detecting only one of disconnection of the tamper detection pattern itself and a short circuit of the tamper detection pattern with other tamper detection pattern.

In the embodiment described above, the two lands 41 and 43 are formed in the FPC 3 for fixing the FPC 3 to the main printed board 2. However, only one land may be formed in the FPC 3 for fixing the FPC 3 to the main printed board 2 or three or more lands may be formed in the FPC 3. Further, in the embodiment described above, it may be structured that the lands 41 and 43 are not formed in the FPC 3.

In the embodiment described above, a shape of the box part 3a when viewed in a thickness direction of the main printed board 2 may be a square shape. Further, in the embodiment described above, the main printed board 2 may be a flexible printed board. Further, in the embodiment described above, the printed board 1 may be mounted and used in an apparatus other than a settlement terminal apparatus. For example, the printed board 1 may be mounted and used in a manual type or a card conveyance type card reader.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A printed board comprising:
a main printed board; and
a flexible printed board which is fixed to the main printed board;
wherein the flexible printed board comprises:
a box part which is formed in a box shape in which an opening facing the main printed board is defined; and
a fixed part which is extended to an outer peripheral side of the box part and is fixed to the main printed board;
the flexible printed board is formed with a plurality of tamper detection patterns;
a tamper detection pattern of the plurality of tamper detection patterns is provided for detecting at least one of disconnection of the tamper detection pattern itself and a short circuit with other tamper detection pattern of the plurality of tamper detection patterns;
an internal land which is one end part of the tamper detection pattern is electrically connected with the main printed board and is disposed on an inner side of the box part;
an external land of a plurality of external lands is another end part of the tamper detection pattern, is formed in the fixed part and is fixed to and electrically connected with the main printed board; and
the plurality of external lands is insulated from each other and each of the plurality of external lands is not electrically connected with other external lands of the plurality of external lands.

2. The printed board according to claim 1, wherein
the main printed board is formed in a flat plate shape,
the flexible printed board comprises a board connection part on which the internal land is formed,
a shape of the box part when viewed in a thickness direction of the main printed board is a rectangular shape or a square shape,
the fixed part is connected with each of three sides of the box part having a rectangular shape or a square shape when viewed in the thickness direction of the main printed board, and
the board connection part is connected with remaining one side of the box part which is not connected with the fixed part and is disposed on an inner side of the box part.

3. The printed board according to claim 2, wherein each of three fixed parts is formed with at least two external lands of the plurality of external lands.

4. The printed board according to claim 3, wherein
the flexible printed board comprises:
a tamper detection pattern layer which is formed with the plurality of tamper detection patterns; and
a ground pattern layer which is formed with a ground pattern covering the plurality of tamper detection patterns from one side in a thickness direction of the flexible printed board and is overlapped with the tamper detection pattern layer, and
the tamper detection pattern layer is disposed on the opening facing the main printed board in the box part and the fixed part.

5. The printed board according to claim 2, wherein the flexible printed board comprises:
- a tamper detection pattern layer which is formed with the plurality of tamper detection patterns; and
- a ground pattern layer which is formed with a ground pattern covering the plurality of tamper detection patterns from one side in a thickness direction of the flexible printed board and is overlapped with the tamper detection pattern layer, and the tamper detection pattern layer is disposed on the opening facing the main printed board in the box part and the fixed part.

6. The printed board according to claim 1, wherein the flexible printed board comprises:
- a tamper detection pattern layer which is formed with the plurality of tamper detection patterns; and
- a ground pattern layer which is formed with a ground pattern covering the plurality of tamper detection patterns from one side in a thickness direction of the flexible printed board and is overlapped with the tamper detection pattern layer, and the tamper detection pattern layer is disposed on the opening facing the main printed board in the box part and the fixed part.

* * * * *